United States Patent

Yoon et al.

[11] Patent Number: 5,648,928
[45] Date of Patent: Jul. 15, 1997

[54] ALIGNMENT STRUCTURE OF A MAIN AMPLIFIER IN A MEMORY DEVICE

[75] Inventors: Oh Sang Yoon, Seoul; Yong Soo Kim, Kyungki-Do, both of Rep. of Korea

[73] Assignee: LG Semicon Co., Ltd., Cheongju, Rep. of Korea

[21] Appl. No.: 574,490

[22] Filed: Dec. 19, 1995

[30] Foreign Application Priority Data

Oct. 12, 1995 [KR] Rep. of Korea ............ 35148/1995

[51] Int. Cl.$^6$ .................................................. G11C 5/06
[52] U.S. Cl. ................................................ 365/63; 365/207
[58] Field of Search ............................. 365/230.03, 63, 365/207, 230.06

[56] References Cited

U.S. PATENT DOCUMENTS

| | | | |
|---|---|---|---|
| 5,274,598 | 12/1993 | Fujii et al. | 365/207 |
| 5,301,142 | 4/1994 | Suzuki et al. | |
| 5,307,324 | 4/1994 | Nishimoto. | |
| 5,499,216 | 3/1996 | Yamamoto | 365/230.03 |

*Primary Examiner*—David C. Nelms
*Assistant Examiner*—F. Niranjan
*Attorney, Agent, or Firm*—Fleshner & Kim

[57] ABSTRACT

In an alignment structure of a main amplifier in a memory device, main amplifiers are aligned between memory cell arrays, so that the data line is shortened from the selected column switch to the main amplifier, to thereby reduce power consumption.

11 Claims, 2 Drawing Sheets

ALIGNMENT STRUCTURE OF A MAIN AMPLIFIER IN A MEMORY DEVICE

BACKGROUND OF THE INVENTION

1. Field of the Invention

The present invention relates to an alignment structure of a main amplifier in a memory device in which main amplifiers are aligned between different memory cell arrays to thereby reduce power consumption of the main amplifiers.

2. Description of the Prior Art

A conventional memory device includes, with reference to FIG. 1, a control and address buffer unit 10 for outputting row and column address signals RADS and CADS, row decoder enable signal REN, and first to fourth main amplifier enable signals MEN0–MEN3 when row and column address strobe signals/RAS and/CAS, a write enable signal /WE, an output enable signal /OE and an address signal ADS are provided from an external source; first and second row decoders 20 and 30 for respectively outputting word line select signals WL0–WLn according to the row decoder enable signal REN and the row address signal RADS; a column decoder 40 for outputting bit line select signals BL0–BLm in accordance with the column decoder enable signal CEN and the column address signal CADS provided from the control and address buffer 10; first and second memory cell arrays 50 and 60 for outputting stored data in accordance with both the bit line select signals BL0–BLm provided from the column decoder 40 and the word line select signals WL0–WLn respectively provided from the first and second row decoders 20 and 30; first and second sense amplifiers 51 and 61 for amplifying the data provided from the first and second memory cell arrays 50 and 60; first and second column switches 52 and 62 for switching an output of the data CD0–CD3 and/CD0–/CD3 amplified by the first and second sense amplifiers 51 and 61; first to fourth main amplifiers 71–74 for respectively amplifying the data CD0–CD3 and /CD0–/CD3 provided through the first and second column switches 52 and 62; and an input/output buffer 80 for buffering the data amplified by the main amplifiers 71–74 and outputting the buffered data Dout to an outside of the memory device.

The first and second memory cell arrays 50 and 60 respectively includes a plurality of cells. The memory device is exemplarily constructed as having four main amplifiers.

The operation of the conventional memory device as constructed above will now be described with reference to FIG. 1.

First, when the memory device is operated to be read, the output enable signal /OE becomes active. Subsequently, as the row address strobe signal /RAS and the column address strobe signal /CAS become respectively active, the row address RADS and the column address CADS are respectively latched by the control and address buffer unit 10. Accordingly, the first and second row decoder 20 and 30 are respectively enabled in accordance with the row decoder enable signal REN provided from the control and address buffer 10 for decoding the row address RADS latched by the control and address buffer 10, and output the word line select signals W0O–WLn to the first and second memory cell arrays 50 and 60. In the meantime, the column decoder 40 is enabled by the column decoder enable signal CEN for decoding the column address CADS latched by the control and address buffer 10, and outputs the bit line select signals BL0–BLm to the first and second memory cell arrays 50 and 60.

Accordingly, the first and second memory cell arrays 50 and 60 respectively output the data stored at a cell designated in accordance with the word line select signals WL0–WLn and the bit line select signals BL0–BLm to the first and second sense amplifiers 51 and 61. The first and second sense amplifiers 51 and 61 amplify the inputted data and output the amplified data to the first and second column switches 52 and 62. The first and second column switches are turned on or turned off in response to the bit line select signals BL0–BLm, and provide the data 52, 62, CD0–CD3 and /CD0–/CD3 to the first to fourth main amplifiers 71–74.

At this time, among the first to fourth main amplifiers 71–74, one main amplifier is enabled by the main amplifier enable signals MEM0–MEN3, so that the inputted data is amplified and the amplified data is outputted to the input/output buffer 80 through an input/output data line CDS and /CDS. Subsequently, the input/output buffer 80 buffers the inputted data, and the buffered data Dout is outputted to an outside of the memory device.

In the meantime, when the memory device is operated to be written, the write enable signal /WE becomes active, and a data Din is inputted from an external source to the input/output buffer 80. After that, a process that inputted data is stored at the first and second memory cell arrays 50 and 60 is the opposite to the read operation, thus, description of the corresponding operation is omitted here.

However, such a conventional memory device as described above has disadvantages in that when the bit line selected by the column decoder is changed, time for the data to be transmitted to each main amplifier is varied according to a length of the data line corresponding to the changed bit line. Therefore, the main amplifier is unnecessarily in an enabled state for a long time, causing increasing power consumption.

SUMMARY OF THE INVENTION

Therefore, an object of the present invention is to provide an alignment structure of a main amplifier in a memory device capable of reducing power consumption by aligning main amplifiers between different memory cell arrays.

In order to obtain the above object, there is provided an alignment structure of a main amplifier in a memory device in which when first and second memory cell arrays including a plurality of sense amplifiers and a plurality of column switches are referenced, the column decoders connected to the first and second memory cell arrays are aligned at an outside of the first and the second memory cell arrays, and main amplifiers amplifying data provided from the sense amplifiers and the column switches are aligned between the first and second memory cell arrays.

DETAILED DESCRIPTION OF THE INVENTION

The preferred embodiment of the present invention will now be described with reference to FIG. 2.

Figure 1:
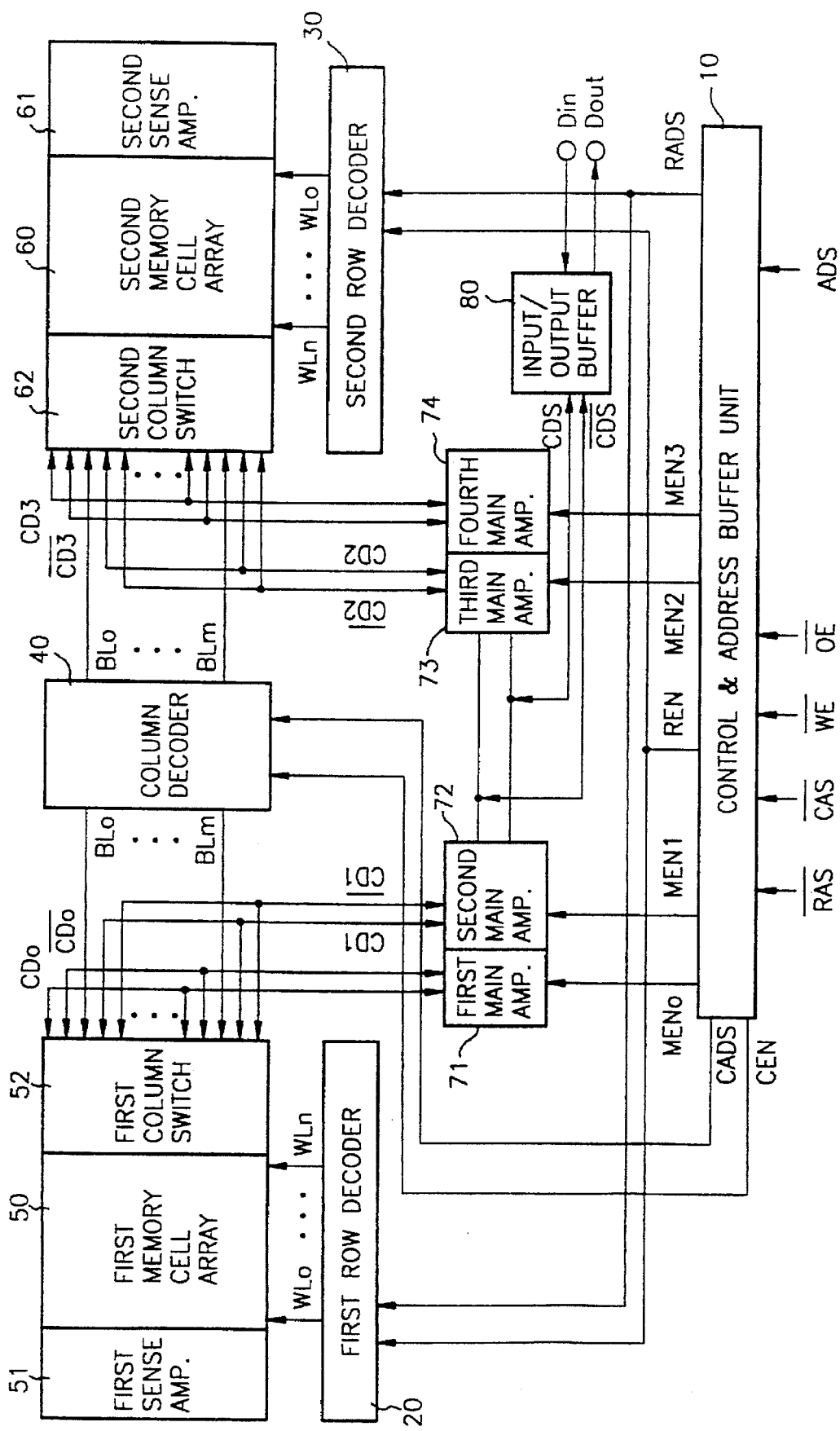
FIG. 1 is a block diagram of a conventional memory device.
Figure 2:
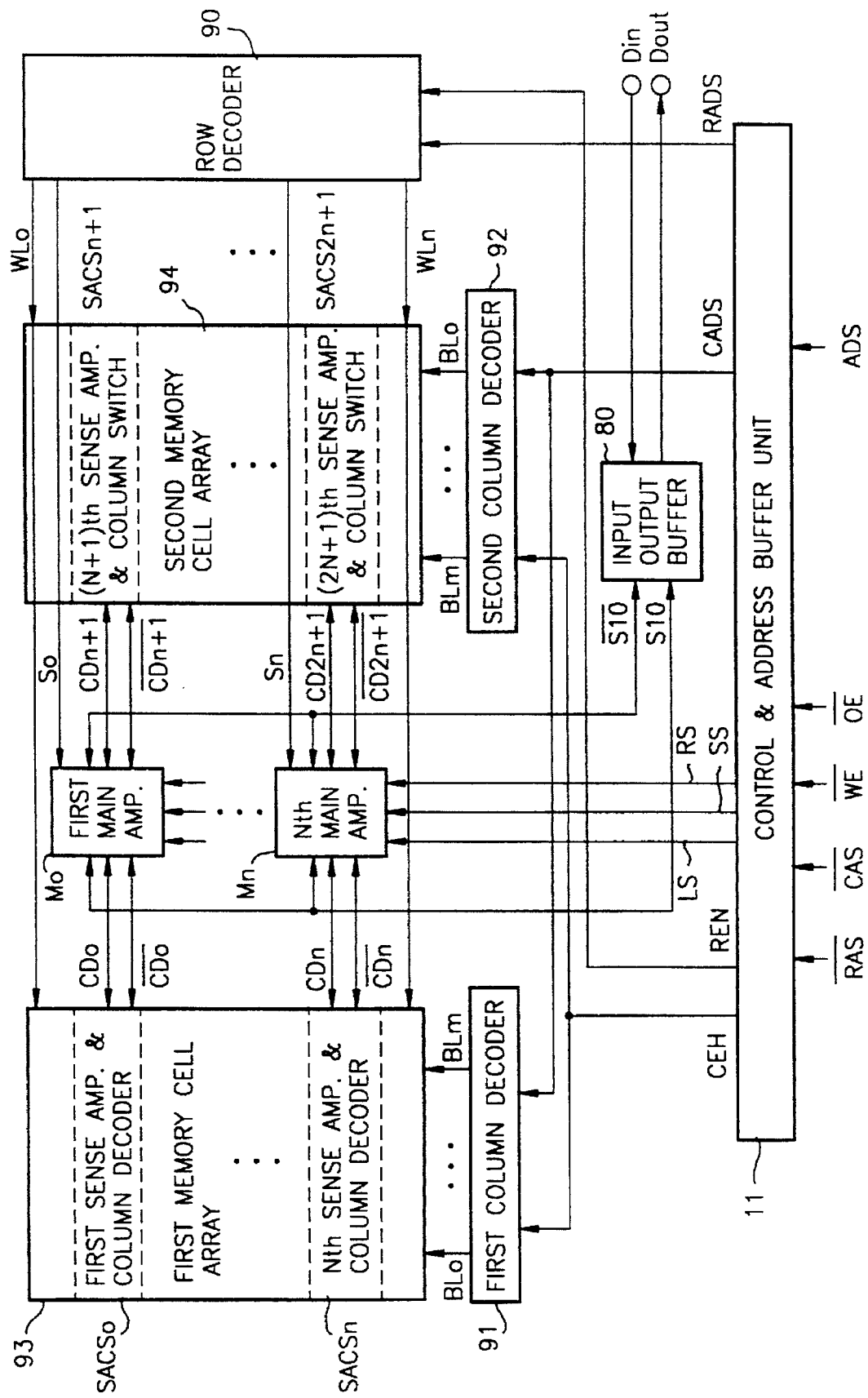
FIG. 2 is a block diagram of a memory device in accordance with the present invention.

A memory device having an alignment structure of a main amplifier according to the present invention includes, as shown in FIG. 2, a control and address buffer unit 11 for outputting row and column address signals RADS and CADS, row and column decoder enable signals REN and CEN, right and left sense signals LS and RS, and a short signal SS when row and column address strobe signals /RAS and /CAS, a write enable signal /WE, an output enable signal /OE, and an address signal ADS are respectively provided from an external source; a row decoder 90 for respectively outputting word line select signals WL0–WLn and main amplifier select signals S0–Sn in accordance with the row decoder enable signal REN and the row address signal RADS provided from the control and address buffer 11; first and second column decoders 91 and 92 for respectively outputting bit line select signals BL0–BLm in accordance with the column decoder enable signal CEN and the column address signal CADS provided from the control and address buffer unit 11; first and second memory cell arrays 93 and 94 for outputting a stored data in accordance with the bit line select signals BL0–BLm provided from the first and second column decoders 91 and 92 and the word line select signals WL0–WLn respectively provided from the first and second row decoders 20 and 30; first to (2n+1)th sense amplifiers and column switches SACS0~SACS2n+1 for amplifying the data provided from the first and second memory cell arrays 93 and 94 and switching an output of the amplified data; first to n-th main amplifiers M0–Mn for amplifying data CD0~CD2n+1 and /CD0~/CD2n+/1 provided from the sense amplifier column switches SASC0~SASC2n+1 in accordance with the short signal SS and the right and left sense signals LS and RS outputted from the control and address buffer unit 11; and an input/output buffer 80 for buffering the data /SIO and /SIO outputted from the main amplifiers M0–Mn and outputting the buffered data Dout to an outside of the memory device.

The first to (2n+1)th sense amplifier and column switches SACS0~SACS2n+1 includes a plurality of sense amplifiers (not shown) and a plurality of column switches(not shown).

The operation of the memory device as constructed above will now be described in view of differences with the operation of the conventional memory device.

Referring to FIG. 2, one main amplifier is selected among the first to n-th main amplifiers M0–Mn in accordance with main amplifier select signals S0–Sn outputted from a row decoder 90 and a specific cell is designated from first and second memory cell arrays 93 and 94 in accordance with word line select signals WL0–WLn and bit line select signals BL0–BLm outputted from first and second column decoders 91 and 92. Then, data stored at the designated cells is inputted to a main amplifier selected in accordance with the main amplifier select signals S0–Sn through the first to (2n+1)th sense amplifiers and column switches SACS0~SACS2n+1. Subsequently, if data to be inputted to the selected main amplifier is one provided from the first memory cell array 93, the inputted data is sensed and amplified in accordance with the left sense signal LS, while if the data is one provided from the second memory cell array 94, the inputted data is sensed and amplified by the right sense signal RS. Meanwhile, data CD0~CD2n+1 inputted to the other main amplifiers than the selected main amplifier and the inverted data /CD0~/CD2n+/1 become the same to each other in accordance with the short signal SS.

Accordingly, when the data SI0 and /SI0 amplified by the selected main amplifier is inputted to the input/output buffer 80, the inputted data is bufferred and the data Dout is outputted to an outside of the memory device.

As so far described, in the present invention, by aligning the main amplifiers between memory cell arrays in the memory device, in case that the number of the column switches is the same as that of the conventional art, the data line is shortened from the selected column switch to the main amplifier, so that the difference between the shortest data line and the longest data line is reduced and time required for actuating the main amplifier as well as power consumption thereof can be also reduced.

What is claimed is:

1. An alignment structure of a main amplifier in a memory device in which when first and second memory cell arrays including a plurality of sense amplifiers and a plurality of column switches are referenced, column decoders connected to the first and second memory cell arrays are aligned at an outside of the first and second memory cell arrays, and main amplifiers amplifying data provided from the sense amplifiers and the column switches are aligned between the first and second memory cell arrays, wherein the main amplifiers are respectively selected by a row decoder arranged at an outside of the first and second memory cell arrays, and sense and amplify data outputted from the first and second memory cell arrays in accordance with left and right sense signals and a short signal applied from control and address buffer means.

2. The alignment structure according to claim 1, wherein the row decoder is arranged in opposite of the main amplifiers for selecting a wordline and the main amplifier.

3. A memory device comprising:

first and second memory cell arrays, each array having a plurality of memory cells, a plurality of first and second memory cell select lines, and a plurality of sense amplifiers and switches;

first and second decoders for selecting said plurality of first memory cell select lines of said first and second memory cell arrays, respectively;

a third decoder for selecting said plurality of second memory cell select lines of said first and second memory cell arrays;

a plurality of main amplifiers, each main amplifier being aligned with corresponding sense amplifiers and switches of said first and second memory cell array; and means for controlling reading/writing operation of said first and second memory cell arrays, said controlling means providing first and second memory cell array select signals to said plurality of main amplifiers for reading/writing operation of said first and second memory cell array, respectively.

4. The memory device of claim 3, wherein said controlling means comprises a control and address buffer unit responsive to external signals to control the reading/writing operation of said first and second memory cell arrays.

5. The memory device of claim 3, wherein said controlling means is responsive to external signals to generate signals to enable said first, second and third decoders to select corresponding first and second memory cell select lines.

6. The memory device of claim 3, wherein said third decoder selects one of said plurality of main amplifiers.

7. The memory device of claim 3, wherein said first and second decoders comprise column decoders.

8. The memory device of claim 3, wherein said third decoder comprises a row decoder.

9. The memory device of claim 3, wherein said plurality of main amplifiers are located between said first and second memory cell arrays.

10. The memory device of claim 3, wherein said controlling means further provides a short signal to said plurality of main amplifiers such that non-selected main amplifiers are in a state which is the same to each other.

11. The memory device of claim 3 further comprising a buffer for at least one of reading data from a selected memory cell and writing data to the selected memory cell of said first and second memory cell arrays.

* * * * *